United States Patent
Yamashita et al.

(10) Patent No.: US 7,776,670 B2
(45) Date of Patent: Aug. 17, 2010

(54) SILICON THIN-FILM AND METHOD OF FORMING SILICON THIN-FILM

(75) Inventors: Masamichi Yamashita, Otsu (JP); Takashi Iwade, Otsu (JP); Kohshi Taguchi, Kyoto (JP); Mitsuo Yamazaki, Kyoto (JP)

(73) Assignee: Toray Engineering Co., Ltd., Tokyo (JP)

( * ) Notice: Subject to any disclaimer, the term of this patent is extended or adjusted under 35 U.S.C. 154(b) by 102 days.

(21) Appl. No.: 12/304,957

(22) PCT Filed: May 30, 2007

(86) PCT No.: PCT/JP2007/060954

§ 371 (c)(1),
(2), (4) Date: Dec. 15, 2008

(87) PCT Pub. No.: WO2007/145075

PCT Pub. Date: Dec. 21, 2007

(65) Prior Publication Data
US 2009/0321895 A1 Dec. 31, 2009

(30) Foreign Application Priority Data
Jun. 16, 2006 (JP) .............................. 2006-167090

(51) Int. Cl.
H01L 21/00 (2006.01)
(52) U.S. Cl. .................. 438/166; 438/761; 257/637; 257/E29.018; 257/E21.24
(58) Field of Classification Search .................. 438/166, 438/761; 257/637, E29.018, E21.24
See application file for complete search history.

(56) References Cited

U.S. PATENT DOCUMENTS

| 5,641,581 A * | 6/1997 | Nishiyama et al. ........... 428/688 |
| 6,211,096 B1 * | 4/2001 | Allman et al. .............. 438/787 |
| 2005/0089634 A1 * | 4/2005 | Otsuki .................. 427/255.394 |

FOREIGN PATENT DOCUMENTS

| JP | H05-315251 A | 11/1993 |
| JP | H05-331618 A | 12/1993 |
| JP | H07-161474 A | 6/1995 |
| JP | 2002-373778 A | 12/2002 |
| JP | 2005-166400 A | 6/2005 |
| JP | 2006-274390 A | 10/2006 |

* cited by examiner

Primary Examiner—Fernando L Toledo
Assistant Examiner—Ankush K Singal
(74) Attorney, Agent, or Firm—Global IP Counselors

(57) ABSTRACT

Issue Providing a silicon film which can prevent damage of electronic devices formed on a substrate from occurrence, can prevent apparatus arrangement from becoming large-scale one, can improve coherency of a silicon thin film to a substrate, and is hardly happened crack and/or flaking, and providing a method for forming the silicon thin film.

Solving Means A method for forming a silicon thin film according to the present invention is a method for forming a silicon thin film having isolation function or barrier function, on a substrate K using CVD method, and comprises a step for forming a first thin film on the substrate using plasma CVD method employing gas containing hydrogen element and a gas containing silicon element; a step for forming a second thin film using plasma CVD method employing a gas containing nitrogen element and a gas containing silicon element; and a step for forming a third thin film using plasma CVD method employing a gas containing oxygen element and a gas containing silicon element.

18 Claims, 9 Drawing Sheets

(A)

(B)

(C)

(D)

(E)

(F)

SILICON THIN-FILM AND METHOD OF FORMING SILICON THIN-FILM

TECHNICAL FIELD

The present invention relates to a silicon thin film and a method for forming a silicon thin film. More particularly, the present invention relates to a silicon thin film having insulation function or barrier function, and to a method for forming the silicon thin film on a substrate using CVD (Chemical Vapor Deposition) method.

BACKGROUND ART

A silicon nitride film is important as a protection film or an insulation film for a semiconductor device, and thermal CVD method or plasma CVD method is employed for forming the silicon nitride film. For the thermal CVD method, silane ($SiH_4$) gas and ammonia ($NH_3$) gas are employed, and a silicon nitride film is deposited by chemical vapor deposition on a surface of a substrate using thermal decomposition reaction at the temperature of 750~800° C., for example. On the other hand, for the plasma CVD method, also $SiH_4$ gas and $NH_3$ gas are employed as reaction gases, applying high frequency electric field to the reaction gases, and activating those reaction gases by applying the electric energy of the high frequency electric field, and a silicon nitride film is deposited by chemical vapor deposition on a surface of a substrate using plasma reaction at the lower temperature of about 300° C. The silicon nitride film formed by such method has the disadvantage such that crack and/or flaking is easily happened due to intrusion of water or impurities or the like.

As a process for forming a silicon nitride film which is hardly happened crack and/or flaking, a process is disclosed in a patent document 1, for example. The disclosed process employs halogen gas excited by plasma, applies etching process to a surface of a substrate under vacuum condition so as to remove impurities entirely which has remained on the substrate and to form uniform and fine irregularities on the surface of the substrate, so that coherency of the silicon nitride film and the substrate is improved and quality of the film is improved. Also, a technique is disclosed in a patent document 2. The disclosed technique provides a pre-processing chamber at a prior stage with respect to a film forming chamber, irradiates ECR (Electron Cyclotron Resonance) plasma to a surface of a substrate within the pre-processing chamber so as to remove moisture absorbed to the surface of the substrate and moisture included in the thin film formed on the substrate.

Patent document 1: Japanese Patent Laid-Open Gazette No. Tokukaihei 5-315251 (No. 1993-315251 A)

Patent document 2: Japanese Patent Laid-Open Gazette No. Tokukaihei 5-331618 (No. 1993-331618 A)

DISCLOSURE OF THE INVENTION

Problems to be Solved by the Invention

However, when the technique disclosed in the patent document 1 is applied to a substrate on which electronic devices such as organic EL (Electro Luminescence) are formed, the electronic devices themselves may be etched. When the technique disclosed in the patent document 2 is applied to the substrate, the electronic devices are always exposed to ECR plasma when removal of moisture is performed so that the electronic devices are susceptive of plasma damage. Also, apparatus arrangement becomes large-scale one because a pre-processing chamber is provided at the prior stage with respect to the film forming chamber.

The present invention was made in view of such situations. It is an object of the present invention to provide a silicon thin film which can prevent damage of electronic devices formed on a substrate from occurrence, can prevent apparatus arrangement from becoming large-scale one, can improve coherency of a silicon thin film to a substrate, and is hardly happened crack and/or flaking, and to provide a method for forming the silicon thin film.

Means for Solving the Problems

To realize the above object, a method for forming a silicon thin film according to the present invention is a method for forming a silicon thin film having insulation function or barrier function on a substrate K using CVD method, and is characterized in comprising the steps of: forming a first thin film 11 on the substrate K by plasma CVD method, using gas containing hydrogen element and gas containing silicon element; forming a second thin film 12 by plasma CVD method, using gas containing nitrogen element and gas containing silicon element; and forming a third thin film 13 by plasma CVD method, using gas containing oxygen element and gas containing silicon element.

It is preferable that the first thin film 11 is formed at the lowermost layer, and that the second thin film 12 and the third thin film 13 are alternately laminated for multiple layers on the first thin film 11.

It is more preferable that the second thin film 12 and the third thin film 13 are formed so that the second thin film contains Si, H, C, N, and O by the composition of Si:H:C:N:O=1:3~4:1.5~2.5:0.3~1.5: equal to or less than 0.5, and that the third thin film contains Si and O by the composition of Si:O=1:1.9~2.1.

It is further preferable that HMDS (Hexa Methyl DiSilazane) gas is employed as the gas containing silicon element which is used for forming the first thin film 11, the second thin film 12, and the third thin film 13.

A silicon thin film according to the present invention is a silicon thin film having insulation function or barrier function, and is characterized in that a first thin film 11, a second thin film 12, and a third thin film 13 are laminated in this order on a substrate K, wherein the first thin film 11 contains composition elements of H and Si, the second thin film 12 contains Si, H, C, N, and O by the composition of Si:H:C:N:O=1:3~4:1.5~2.5:0.3~1.5: equal to or less than 0.5, and the third thin film contains Si and O by the composition of Si:O=1:1.9~2.1.

It is preferable that the first thin film 11 is formed at the lowermost layer, and that the second thin film 12 and the third thin film 13 are alternately laminated for multiple layers on the first thin film 11.

In the present invention, a substrate is a target to which insulation function and/or barrier function are imparted. The substrate may be resin film itself such as PET (PolyEthylene Terephthalete) film or the like, or the resin film on which electronic devices such as organic EL or the like have been formed.

Effect of the Invention

The present invention provides a silicon thin film which can prevent damage of electronic devices formed on a substrate from occurrence, can prevent apparatus arrangement from becoming large-scale one, can improve coherency of a silicon thin film to a substrate, and is hardly happened crack and/or flaking, and provides a method for forming the silicon thin film.

BEST MODE FOR CARRYING OUT THE INVENTION

Hereinafter, referring to the attached drawings, we explain the best mode for carrying out the present invention.

FIG. 1 is a schematic front view of a sealing film forming apparatus which is used for carrying out the present invention, and FIG. 2 is a schematic plan view of the sealing film forming apparatus illustrated in FIG. 1.

This sealing film forming apparatus is manufactured for experimental film formation, and is different from an apparatus which is used in a production line in a manufacturing plant for producing a semiconductor device such as an organic EL substrate or the like.

As is illustrated in FIG. 1, the sealing film forming apparatus 1 comprises a load lock chamber 2, a robot chamber 3 which is connected directly next to the load lock chamber 2, and a film forming chamber 4 which is connected directly next to the robot chamber 3. A sealing film (silicon thin film) which is an object to be formed by this sealing film forming apparatus 1, is a laminated film made of a silicon nitride film and a silicon oxide film.

The load lock chamber 2 can be isolated from the robot chamber 3 by a gate valve 21. The load lock chamber 2 is connected to a vacuum pump 22 and has a substrate stocker 23 in the interior thereof. The substrate stocker 23 has supporting pins 24 for supporting peripheral sections of a substrate K. Wherein, the substrate K has a size of 370 mm×470 mm. The substrate K is formed organic EL elements 9 on the surface.

The robot chamber 3 has a substrate conveyance robot 31 therein. The substrate conveyance robot 31 has a motor 32, an arm 33, and a movable supporting table 34. The movable supporting table 34 is composed so that the movable supporting table 34 can be moved in each of X, Y, and Z directions by the motor 32 via the arm 33. The movable supporting table 34 has supporting pins 35 which are similar to the supporting pins 24 of the substrate stocker 23.

The film forming chamber 4 is connected directly next to the robot chamber 3, and is connected to a vacuum pump 42, a HMDS supply tank 44, an $NH_3$ supply tank 46, a $H_2$ supply tank 52, an Ar supply tank 53, and an $O_2$ supply tank 55. The film forming chamber 4 is connected to the vacuum pump 42 via a flow control valve 41, is connected to the HMDS supply tank 44 via a flow control valve 43, is connected to the $NH_3$ supply tank 46 via a flow control valve 45, is connected to the $H_2$ supply tank 52 and the Ar supply tank 53 via a flow control valve 51, and is connected to the $O_2$ supply tank 55 via a flow control valve 54. The film forming chamber 4 has a loop antenna 47 therein.

The loop antenna 47 is means for generating plasma, and consists of insulation tubes 48 and a conductive electrode 49. The number of the insulation tubes 48 is 2, and are arranged in opposite condition to one another and in parallel to one another within the film forming chamber 4. The conductive electrode 49 is inserted through the two insulation tubes 48 and passes through the opposite side walls of the film forming chamber 4 so that the conductive electrode 49 expresses nearly U-shaped pattern in its plan view as is illustrated in FIG. 2, and is connected to an electric power supply 50 for supplying high frequency current. It is preferable that the frequency of the high frequency current 50 is 13.56 MHz. Wherein, the plasma used in this process may be CCP (Capacitive Coupled Plasma), ICP (Inductive Coupled Plasma), barrier discharge, hollow discharge or the like.

Then, also referring to FIGS. 3-8, a method for forming a sealing film (silicon thin film) according to the present invention is described. FIGS. 3 and 4 are diagrams illustrating forming stages of a sealing film according to the present invention. FIG. 5 is a flowchart explaining procedure for forming a sealing film according to the present invention. FIG. 6 is a flowchart explaining procedure for forming a first thin film. FIG. 7 is a flowchart explaining procedure for forming a second thin film. FIG. 8 is a flowchart explaining procedure for forming a third thin film.

Description is made under the assumption that the sealing film forming apparatus 1 is in an initial condition which will be described in the following. That is, the load lock chamber 2 is in a condition that the gate valve 21 is closed, so that the inner pressure of the load lock chamber 2 is atmosphere pressure. In the substrate stocker 23, an unsealed substrate K on which surface organic EL elements 9 are formed (refer to FIG. 3(A)) is held under the condition that a face K1 of the substrate K on which the elements are formed, is steered vertically downward. The film forming chamber 4 and the robot chamber 3 are depressurized their inner pressure by the vacuum pump 42 to be equal to or less than $9.9 \times 10^{-5}$ Pa.

At first, in step S1, the vacuum pump 21 starts its operation so as to depressurize the load lock chamber 2. When the inner pressure of the load lock chamber 2 becomes equal to the inner pressure of the film forming chamber 4 and the robot chamber 3, the gate valve 21 is opened. Then, in step S2, the substrate conveyance robot 31 extends the arm 33 to the load lock chamber 2, and receives the unsealed substrate K held in the substrate stocker 23 on the movable supporting table 34, the unsealed substrate K being the same posture, that is the face K1 of the substrate K on which the elements are formed, is steered vertically downward. After the catching of the unsealed substrate K, the substrate conveyance robot 31 rotates the arm 33. After the rotating of the arm 33, the gate valve 21 is closed, and the substrate conveyance robot 31 extends the arm 33 in the film forming chamber 4, as is illustrated with chain double-dashed line in FIG. 1, thereby the substrate K is set above the loop antenna 47.

When the substrate K is set in the film forming chamber 4, in step S3, forming process of the first thin film 11 is started. At first, mixed gas of $H_2$ gas and Ar gas is introduced into the film forming chamber 4 by opening the flow control valve 51. At the same time, HMDS gas is introduced into the film forming chamber 4 by opening the flow control valve 43. Dissociation reaction can be carried out with plasma having relatively small energy, by the introduction of Ar gas. It is preferable that introducing flow volume of each gas at this stage is determined so that the introducing flow volume of the mixed gas of $H_2$ gas and Ar gas is 20 sccm~40 sccm, and the introducing flow volume of HMDS gas is 3 sccm~5 sccm (step S31). When each introducing flow volume is not within corresponding extent, an intended film is not formed. Thereby, disadvantages such as film flaking, crack arise.

Then, high frequency current is flown into the loop antenna 47 from the electric power supply 50. By the high frequency current, plasma is generated in periphery of the loop antenna 47. It is preferable that the plasma power at this stage is 5 kW ~10 kW (step S32). The reason is that when the plasma power is smaller than this extent, ionization of the gas due to the plasma becomes smaller, thickness of formed film becomes thinner, thereby film forming time becomes longer, and on the contrary, when the plasma power is greater than this extent, etching, sputtering due to plasma are generated, a formed film is scraped or an unintended film is generated. On the surface of the substrate K, surface reaction is carried out, thereby the first thin film 11 is formed to cover the organic EL elements 9, as is illustrated in FIG. 3(B). After a predetermined time period T1 has passed, introducing of the mixed gas of $H_2$ gas and Ar gas is stopped by closing the flow control valve 51 (step S33). The predetermined time period T1 is a time period for forming a thin film having a thickness of 15 nm, for example, and is 45 seconds for the apparatus of FIG. 1.

When the first thin film 11 has formed, in step S4, forming process of the second thin film 12 is started. At first, $NH_3$ gas is introduced into the film forming chamber 4 by opening the flow control valve 45. $N_2$ gas may be introduced instead the $NH_3$ gas. At the same time, introducing flow volume of HMDS gas is controlled by the flow control valve 43. It is preferable that introducing flow volume of each gas at this stage is determined so that the introducing flow volume of the $NH_3$ gas is 5 sccm~500 sccm, and the introducing flow volume of HMDS gas is 3 sccm~20 sccm (step S41). When each introducing flow volume is not within corresponding extent, an intended film is not formed. Thereby, disadvantages such as film flaking, crack arise.

Then, high frequency current is flown into the loop antenna 47 from the electric power supply 50 so as to make the plasma power to be 0.1 kW~8 kW. The reason is that when the plasma power is smaller than this extent, ionization of the gas due to the plasma becomes smaller, thickness of formed film becomes thinner, thereby film forming time becomes longer, and on the contrary, when the plasma power is greater than this extent, etching, sputtering due to plasma are generated, thereby a formed film is scraped or an unintended film is generated. By the high frequency current, plasma is generated in periphery of the loop antenna 47 (step S42). On the surface of the substrate K, surface reaction is carried out, thereby the second thin film 12, that is the silicon nitride film is formed to cover the first thin film 11, as is illustrated in FIG. 3(C).

After a predetermined time period T2 has passed, introducing of the $NH_3$ gas is stopped by closing the flow control valve 45 (step S43). The predetermined time period T2 is a time period for forming a silicon nitride film having a thickness of 50 nm, for example, and is 2 minutes for the apparatus of FIG. 1. It is preferable that the silicon nitride film contains Si, H, C, N, and O by the composition of Si:H:C:N:O=1:3~4:1.5~2.5: 0.3~1.5: equal to or less than 0.5. Though the chemical formula of HMDS is $(CH_3)_3SiNHSi(CH_3)_3$, the HMDS supply tank 44 acts as a supply source of C.

When the second thin film 12 has formed, in step S5, forming process of the third thin film 13 is started. At first, $O_2$ gas is introduced into the film forming chamber 4 by opening the flow control valve 54. At the same time, introducing flow volume of HMDS gas is controlled by the flow control valve 43. It is preferable that introducing flow volume of each gas at this stage is determined so that the introducing flow volume of the $O_2$ gas is 20 sccm~1000 sccm, and the introducing flow volume of HMDS gas is 3 sccm~20 sccm (step S51). When each introducing flow volume is not within corresponding extent, an intended film is not formed. Thereby, disadvantages such as film flaking, crack arise.

Then, high frequency current is flown into the loop antenna 47 from the electric power supply 50 so as to make the plasma power to be 0.1 kW~8 kW. The reason is that when the plasma power is smaller than this extent, ionization of the gas due to the plasma becomes smaller, thickness of formed film becomes thinner, thereby film forming time becomes longer, and on the contrary, when the plasma power is greater than this extent, etching, sputtering due to plasma are generated, thereby a formed film is scraped or an unintended film is generated. By the high frequency current, plasma is generated in periphery of the loop antenna 47 (step S52). On the surface of the substrate K, surface reaction is carried out, thereby the third thin film 13, that is the silicon oxide film is formed to cover the second thin film 12, as is illustrated in FIG. 4(D). After a predetermined time period T3 has passed, introducing of the $O_2$ gas is stopped by closing the flow control valve 54 (step S53). The predetermined time period T3 is a time period for forming a silicon oxide film having a thickness of 100 nm, for example, and is 2 minutes for the apparatus of FIG. 1. It is preferable that the silicon oxide film contains Si, and O by the composition of Si:O=1:1.9~2.1.

The process of step S4 and the process of step S5 are repeated for N-times (in the present embodiment, N=2). As a result, a laminated body which is made by laminating the silicon oxide film (third thin film 13) on the silicon nitride film (second thin film 12), is formed in 2 layers, as is illustrated in FIG. 4(F). As is apparent from the foregoing, at first, the first thin film 11 is formed on the substrate K by Plasma CVD method and by using $H_2$ gas, Ar gas, and HMDS gas which are used as raw material gases, then the second thin film 12 which is a silicon nitride film is formed on the first thin film 11 by using $NH_3$ gas and HMDS gas, and then the third thin film 13 which is a silicon oxide film is formed on the second thin film 12 by using $O_2$ gas and HMDS gas.

It is proved that the first thin film 11 formed in step S3 has good coherency. Specifically, good coherency is confirmed by carrying out evaluation using tape peeling test in which evaluation is carried out by cutting and forming 10×10 grids with 2 mm interval which is similar to gridiron, adhering an adhesive tape thereon, then peeling the adhered adhesive tape, and measuring a number of peeled grids. By laying this first thin film 11 between the substrate K and the second thin film 12, coherency of the substrate K and the second thin film 12 and the subsequent film is improved. As a result, the second thin film 12 is hardly happened flaking and/or crack, thereby the second thin film 12 can be made to be a reliable film having small unevenness of the performance. Further, it is proved that barrier characteristic against moisture and oxygen is extremely improved by laminating the second thin film 12 and the third thin film 13 alternately for multiple layers. Details thereof is described in the column of example.

The method according to the present invention does not give damage to electronic devices such as organic EL elements 9, because the method does not employ etching process and the like, which method is different from conventional methods. The laminated body made of the second thin film 12 and the third thin film 13 has a function for protecting the electronic devices such as organic EL elements 9 against the plasma energy following chemically crystal growth from vapor on the substrate K. Thereby damage to the electronic devices due to the plasma energy becomes smaller. The apparatus construction does not become a large-scale one, because the forming of the second thin film 12 and the forming of the third thin film 13 are carried out within the same chamber (film forming chamber 4). In the method, explosion might not be happened, and the method is excel in safety, because HMDS gas is used as raw material gas.

It is preferable that the temperature is equal to or less than 100° C. when each film is formed, for avoiding damage of the organic EL devices themselves due to heat, on the substrate which has formed organic EL devices. During the above sealing film forming, the movable supporting table 34 could be moved in oscillating manner in X direction at predetermined cycle. Due to this, a uniform film having no irregularity is realized.

When the laminated body made of the second thin film 12 and the third thin film 13 has finished forming for N-stages (yes in step S6), the gate valve 21 is opened in the load lock chamber 2, the substrate conveyance robot 31 rotates the arm 33 and thereafter extends the arm into the load lock chamber 2. Then, the sealed substrate K is transferred to the substrate stocker 23, thereafter the substrate conveyance robot 31 rotates the arm 33. After the arm 33 is rotated, the gate valve 21 is closed, and the load lock chamber 2 is returned its inner pressure to atmosphere pressure and is opened, in step S7. Thereafter, in step S8, the substrate K having formed the sealing film can be taken out to an outer section.

Example

Hereinafter, we explain examples according to the present invention. FIG. 9 is a diagram useful in understanding trapping effect of the sealing film for trapping moisture and oxygen.

By the manner of above embodiment, a first thin film 11 is formed on a PET film substrate, and a silicon nitride film and a silicon oxide film are alternately formed on the first thin film 11, a number of each film being 10, as a result, a laminated film of total 21 layers is formed on the PET film substrate. The laminated film of total 21 layers is measured by mocon method which is a kind of a low Permeability measurement and a water vapor permeating degree of 0.02 g/m$^2$·day is obtained which is the lower limit of the measurement. This low water vapor permeating degree represents that protecting characteristic (barrier characteristic) against moisture is high. As a comparative example, a single film of silicon nitride film and a single film of silicon oxide film are formed respectively on a PET film substrate. The laminated film is measured by mocon method, a kind of a low Permeability measurement, and a water vapor permeating degree of 0.15 g/m$^2$·day is obtained. From the both measurement results, effect due to laminated film of multiple layers is sufficiently recognized.

By the manner of above embodiment, a first thin film 11 is formed on a glass substrate, and a silicon nitride film and a silicon oxide film are alternately formed on the first thin film 11, so that a laminated film of total 5 layers is formed on the glass substrate (refer to the condition of FIG. 4(F)). The laminated film of total 5 layers is measured by RBS (Rutherford Back-Scattering Spectroscopy) measurement, a quantity of oxygen (oxygen percentage within the film composition is 1.5%) is detected in the fourth layer which is the upper layer and is in vicinity of atmosphere, but no oxygen is detected in the second layer which is the lower layer and is apart from atmosphere. From the detection result, it is understood that protection characteristic against oxygen is superior. For the information, oxygen permeating amount is 0.1 cm$^3$/m$^2$·day which is obtained by measuring a PET film on which a laminated film of total 5 layers is formed.

Referring to FIG. 9, the reason is described that the sealing film formed by the method according to the present invention is superior in protection characteristic against moisture and oxygen, as is described above. In FIG. 9, and when an air gap 131 such as crack, film non-formed section, for example, exists in the silicon oxide film (the third thin film) 13, moisture and oxygen in the atmosphere are blocked in mid-flow, as is illustrated with a solid arrow A1, and never reach to the lowest layer (refer to dashed arrow A2). This is because the silicon nitride film (the second thin film) 12 acts as a getter (capture means) of moisture and oxygen. That is, this is because the silicon nitride film 12 has configuration for adsorbing moisture and oxygen. It is expected that this effect can be improved more by increasing a number of laminated layers. Moisture and oxygen permeating the silicon oxide film 13 itself exist even when no air gap 131 such as crack, film non-formed section exists in the silicon oxide film 13. In this case, moisture and oxygen are blocked in mid-flow, as is illustrated with a solid arrow A3 by the similar reason, thereby moisture and oxygen never reach the lowermost layer (refer to dashed arrow A4).

Embodiments according to the present invention are described in the foregoing. The embodiments disclosed in the foregoing are only exemplifications. The scope of the present invention is not limited to the embodiments. The scope of the present invention is shown by claims. And, it is intended that every modification within equivalent meaning and equivalent scope of claims is included.

DESCRIPTION OF THE REFERENCES

Figure 1:
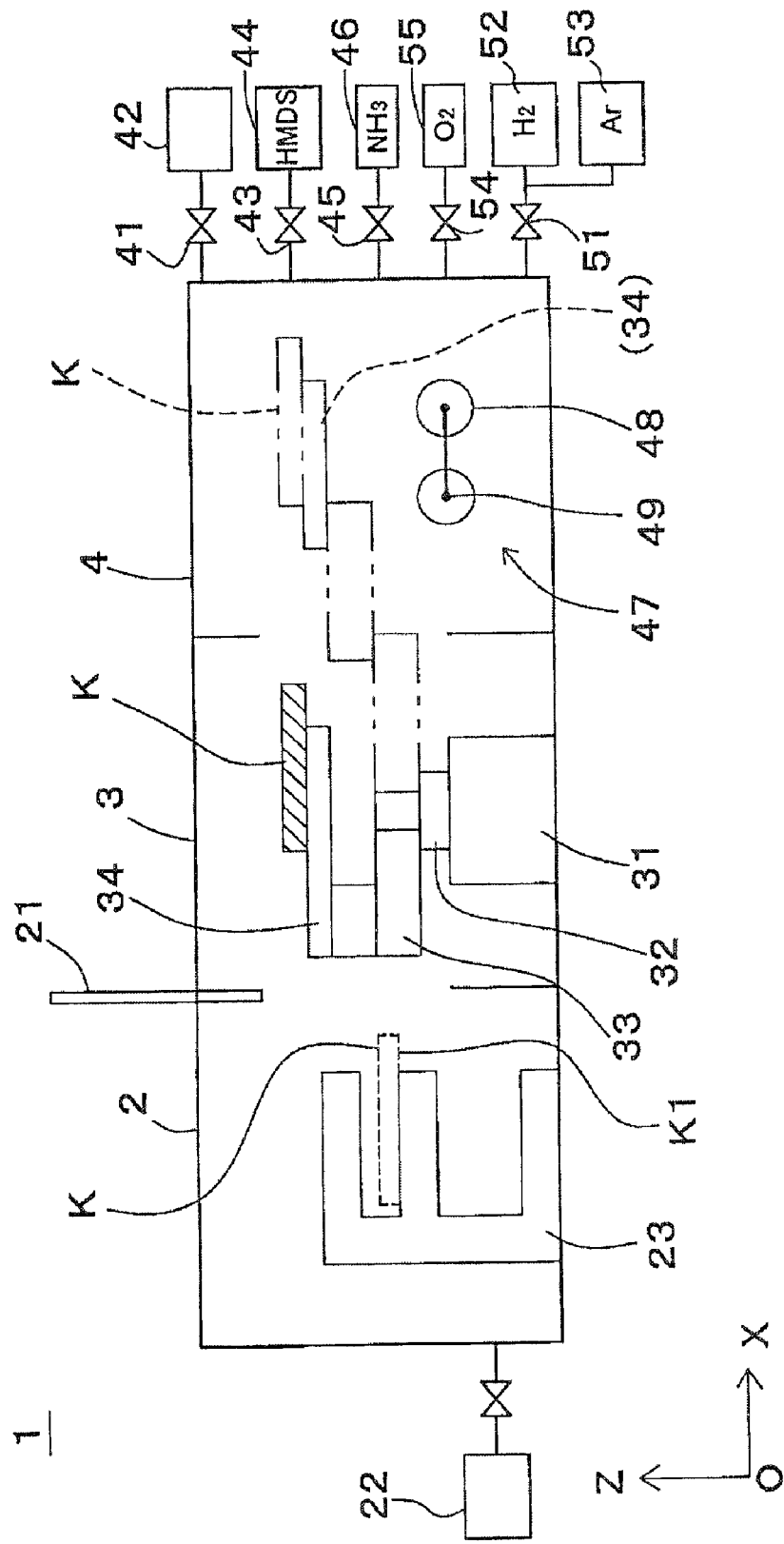
FIG. 1 is a schematic front view of a sealing film forming apparatus which is used for carrying out the present invention.
Figure 2:
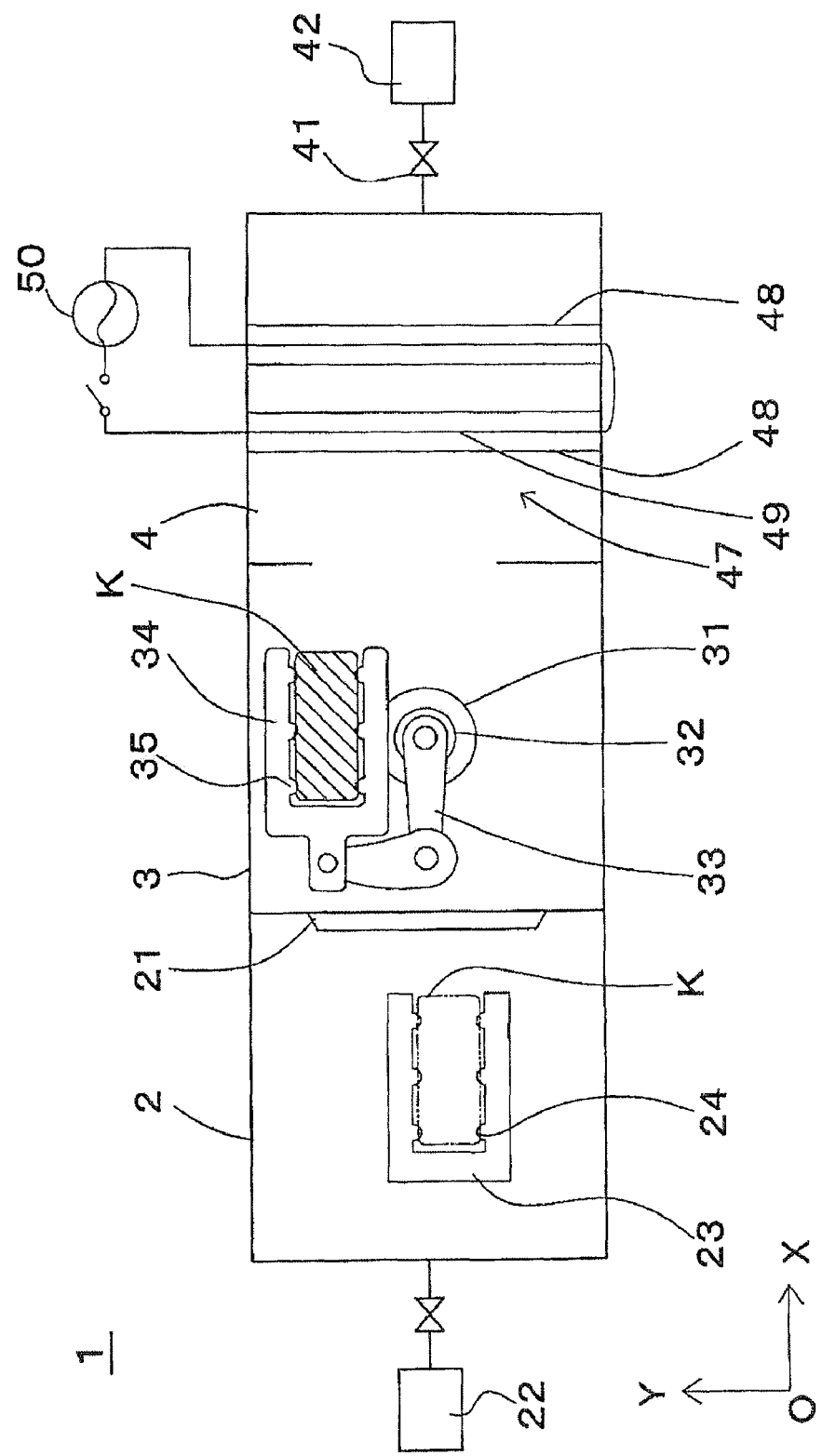
FIG. 2 is a schematic plan view of the sealing film forming apparatus illustrated in FIG. 1.
Figure 3:
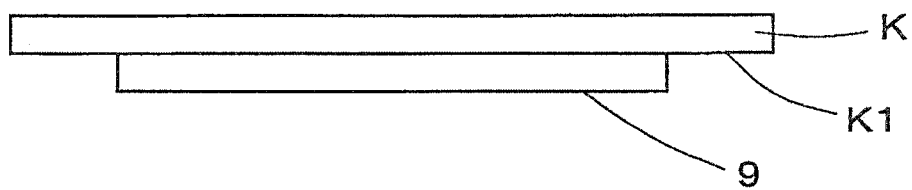
FIG. 3 are diagrams for illustrating forming stages of a sealing film according to the present invention.
Figure 3:
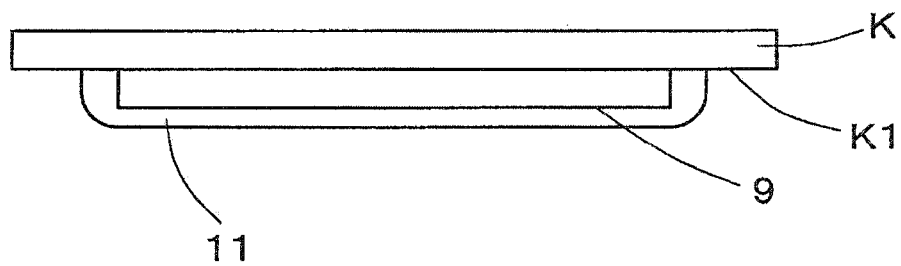
Figure 3:
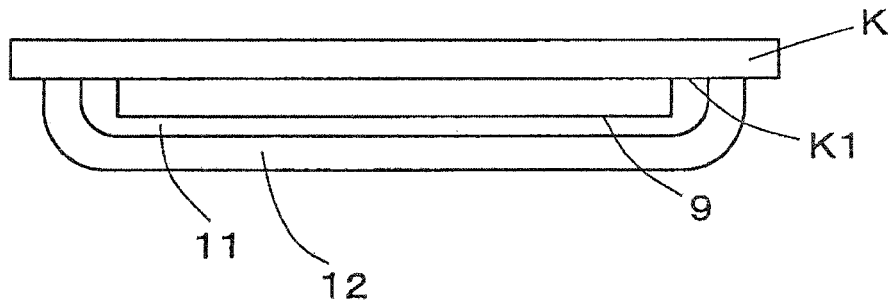
Figure 4:
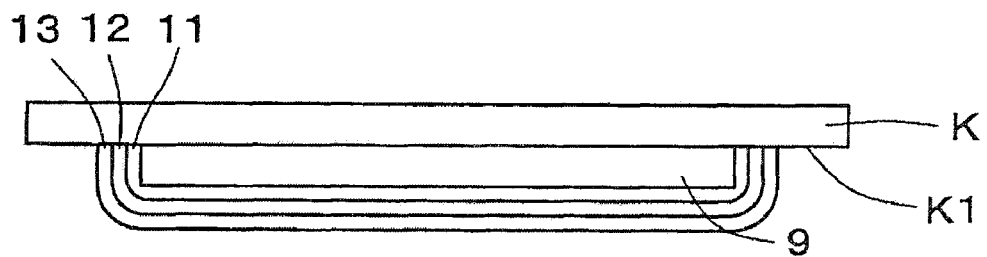
FIG. 4 are diagrams for illustrating forming stages of a sealing film according to the present invention.
Figure 4:
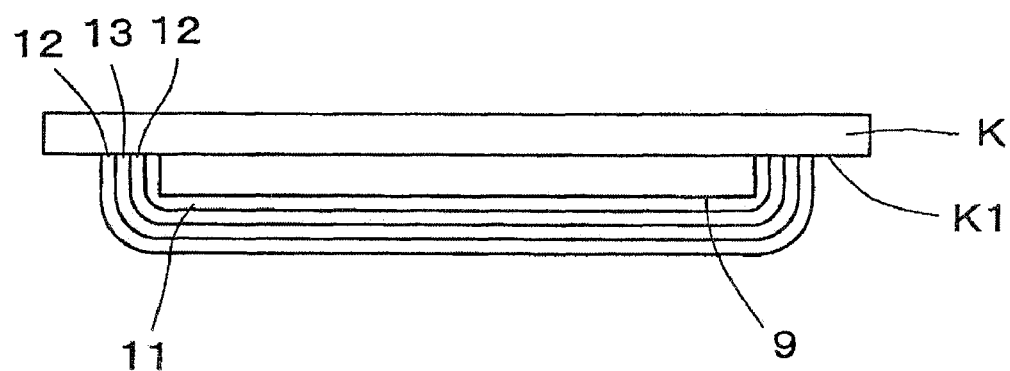
Figure 4:
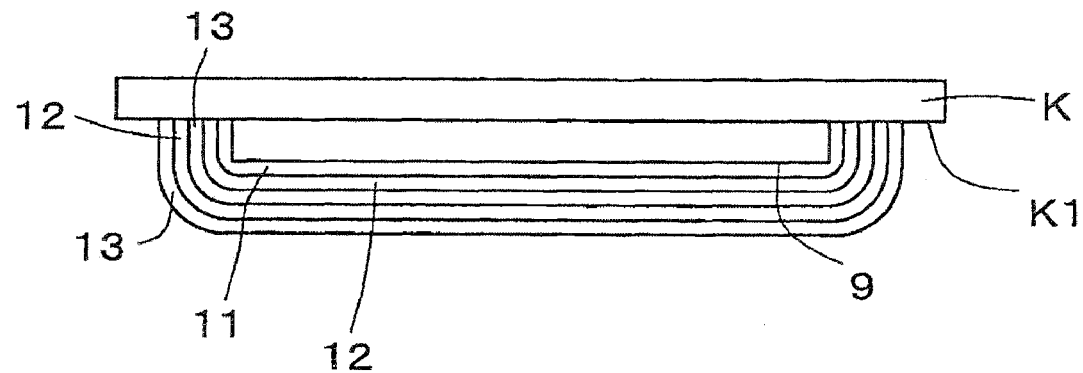
Figure 5:
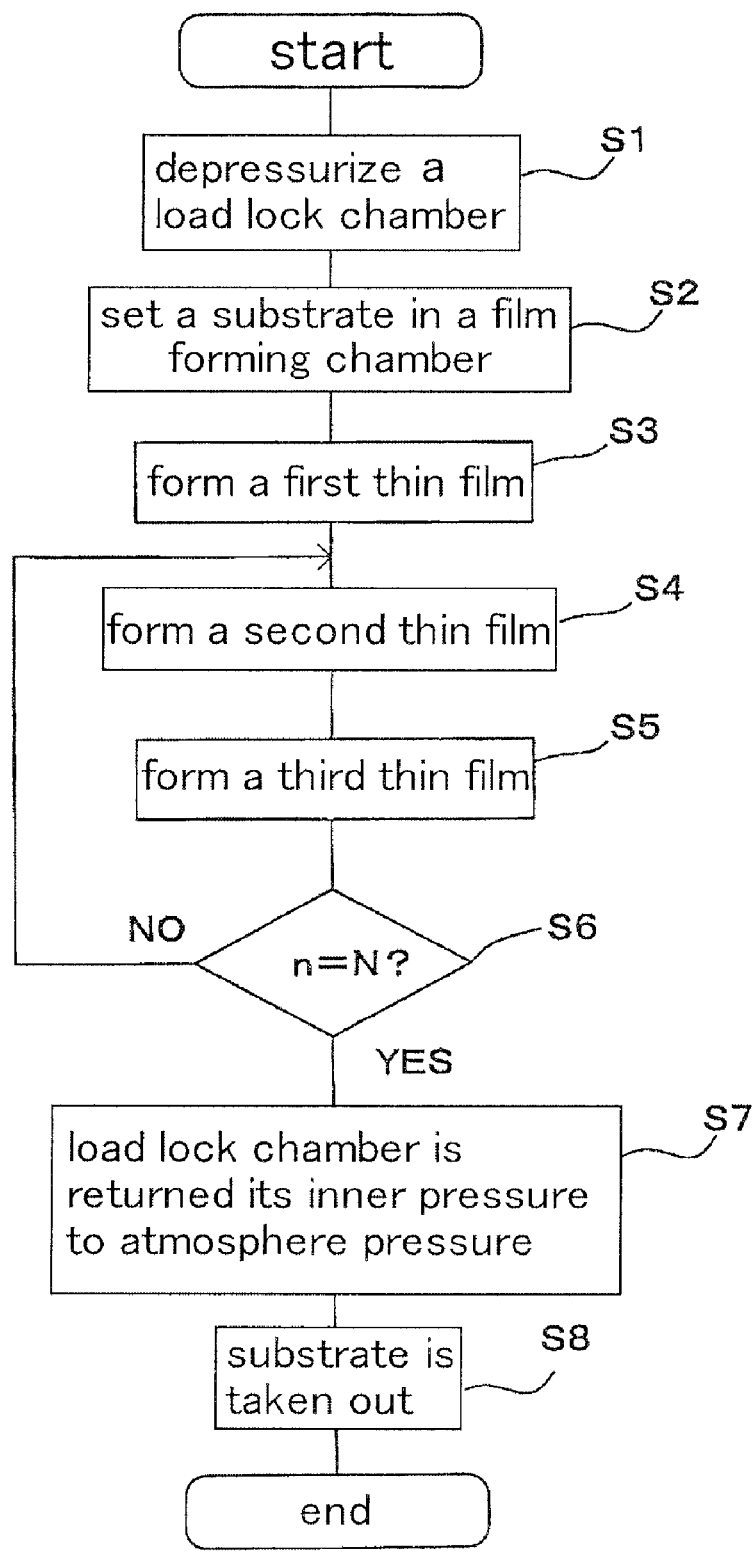
FIG. 5 is a flowchart illustrating procedure for forming a sealing film according to the present invention.
Figure 6:
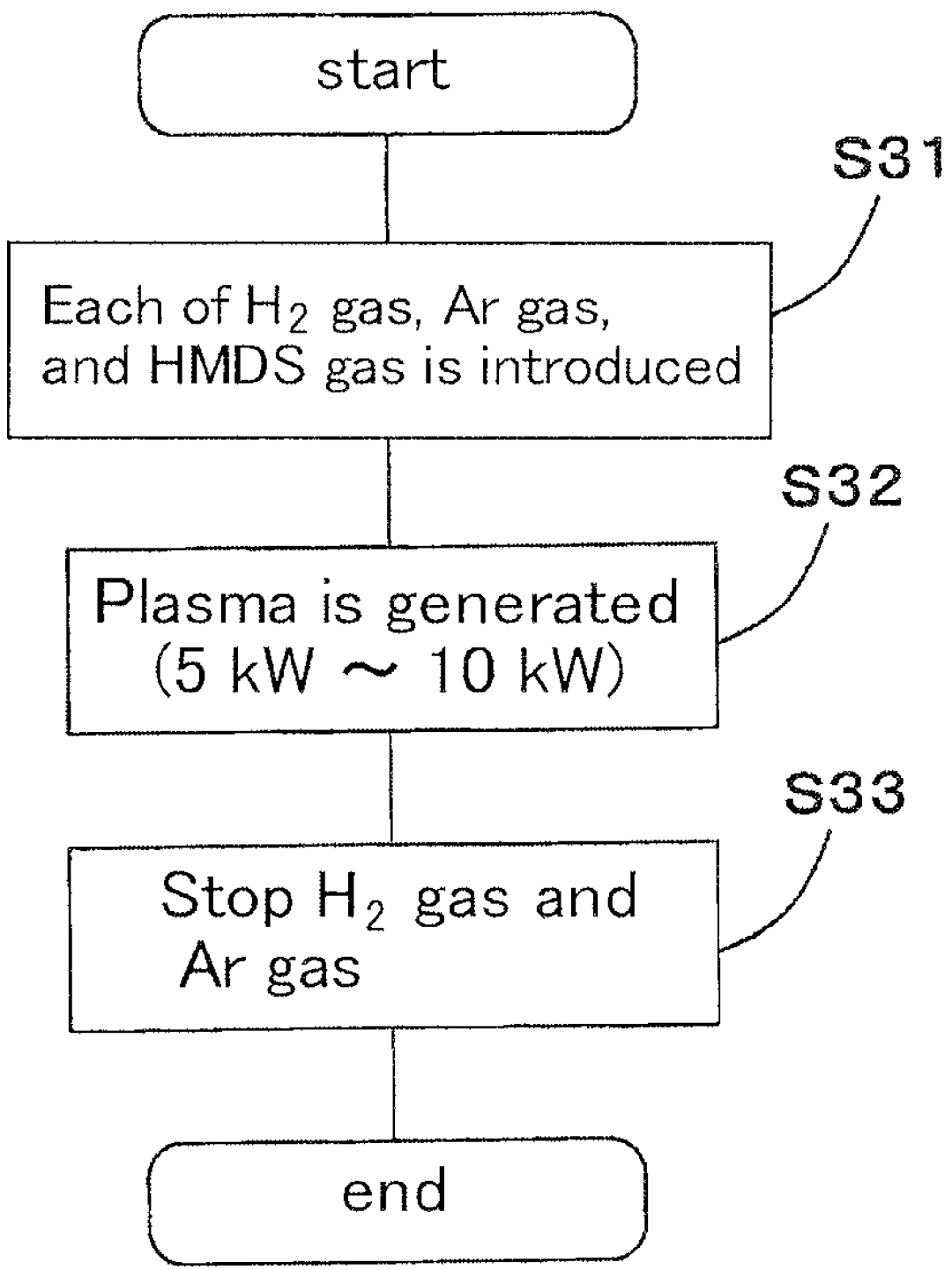
FIG. 6 is a flowchart illustrating procedure for forming a first thin film.
Figure 7:
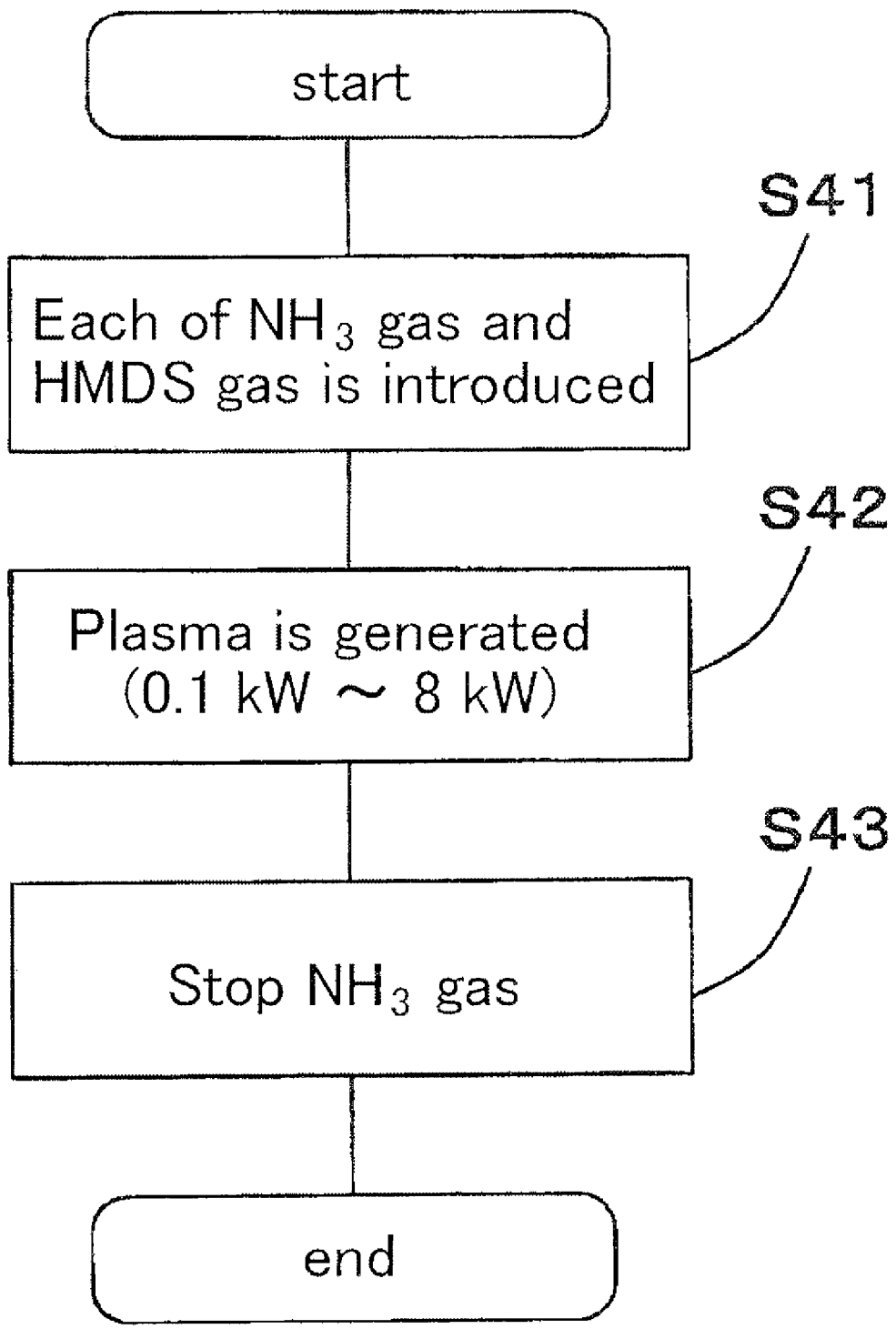
FIG. 7 is a flowchart illustrating procedure for forming a second thin film.
Figure 8:
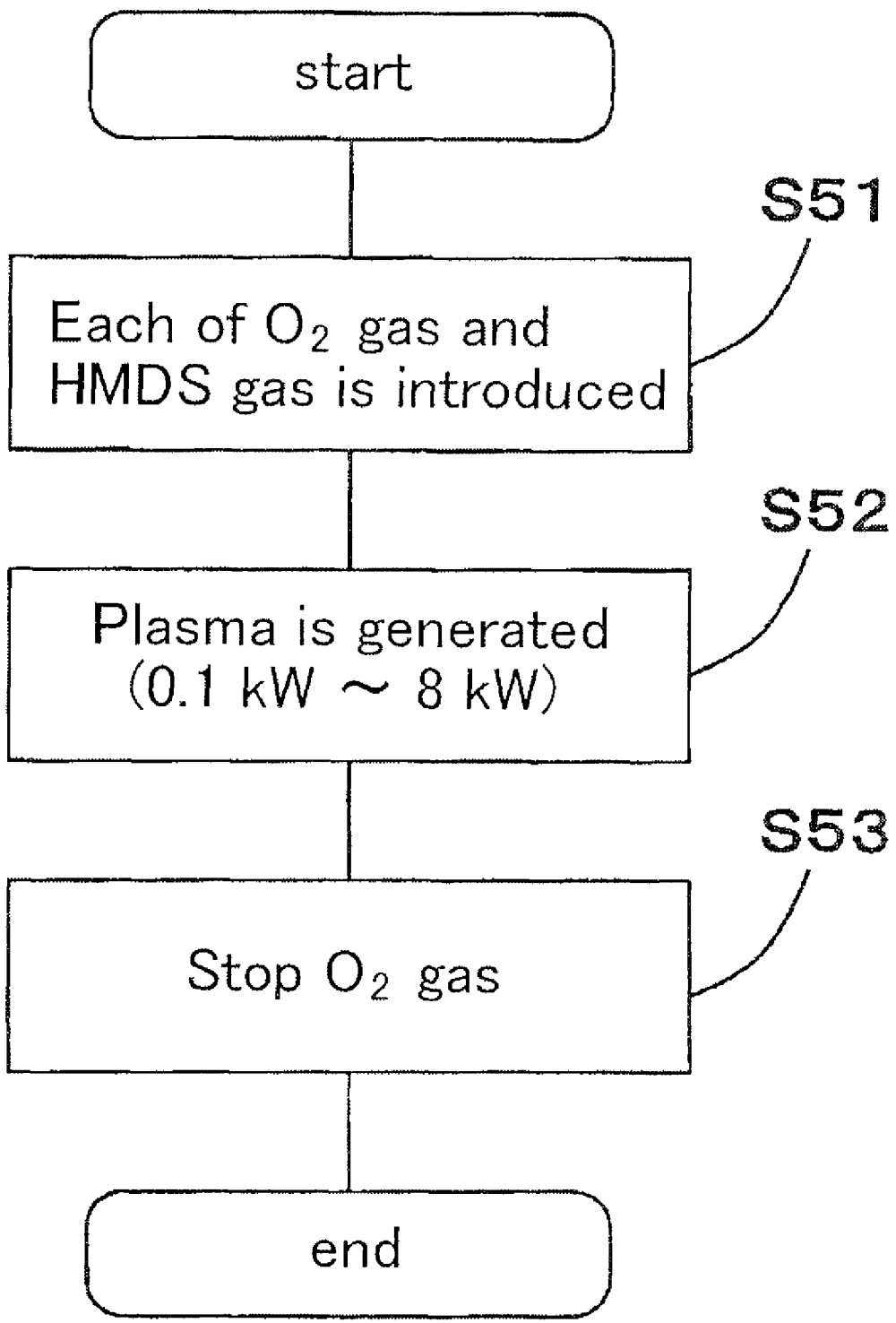
FIG. 8 is a flowchart illustrating procedure for forming a third thin film.
Figure 9:
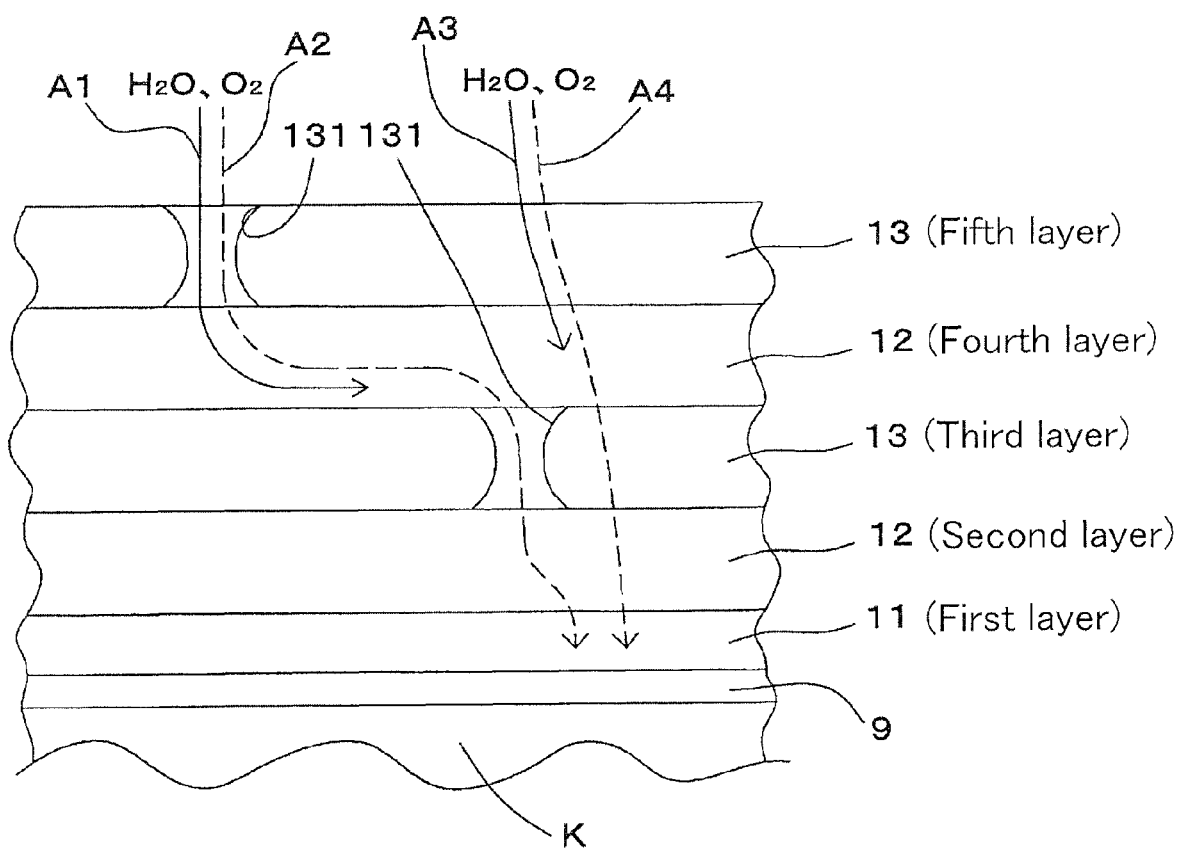
FIG. 9 is a diagram useful in understanding capturing effect of a sealing film according to the present invention for capturing moisture and oxygen.

9 organic EL element (electronic device)
11 first thin film
12 second thin film
13 third thin film
K substrate

What is claimed is:

1. A method for forming a silicon thin film having insulation function or barrier function, on a substrate using CVD (Chemical Vapor Deposition) method, comprising:
    a step for forming a first thin film on the substrate using plasma CVD method employing a gas containing hydrogen element and a gas containing silicon element;
    a step for forming a second thin film using plasma CVD method employing a gas containing nitrogen element and a gas containing silicon element; and
    a step for forming a third thin film using plasma CVD method employing a gas containing oxygen element and a gas containing silicon element.

2. A method for forming a silicon thin film as set forth in claim 1, wherein the first thin film is formed as the lowermost layer, and the second thin film and the third thin film are alternately laminated by multiple layers on the first thin film.

3. A method for forming a silicon thin film as set forth in claim 1, wherein the second thin film and the third thin film are formed so that the second thin film contains Si, H, C, N, and O by the composition of Si:H:C:N:O=1:3~4:1.5~2.5:

0.3~1.5: equal to or less than 0.5, and that the third thin film contains Si, and O by the composition of Si:O=1:1.9~2.1.

4. A method for forming a Silicon thin film as set forth in claim 1, wherein HMDS (Hexa Methyl DiSilazane) gas is employed as the gas containing silicon element which is employed for forming the first thin film, the second thin film and the third thin film.

5. A Silicon thin film formed by the method for forming a Silicon thin film as set forth in claim 1.

6. A method for forming a silicon thin film as set forth in claim 2, wherein the second thin film and the third thin film are formed so that the second thin film contains Si, H, C, N, and O by the composition of Si:H:C:N:O=1:3~4:1.5~2.5:0.3~1.5: equal to or less than 0.5, and that the third thin film contains Si, and O by the composition of Si:O=1:1.9~2.1.

7. A method for forming a Silicon thin film as set forth in claim 2, wherein HMDS gas is employed as the gas containing silicon element which is employed for forming the first thin film, the second thin film and the third thin film.

8. A Silicon thin film formed by the method for forming a Silicon thin film as set forth in claim 2.

9. A method for forming a Silicon thin film as set forth in claim 3, wherein HMDS gas is employed as the gas containing silicon element which is employed for forming the first thin film, the second thin film and the third thin film.

10. A Silicon thin film formed by the method for forming a Silicon thin film as set forth in claim 3.

11. A method for forming a Silicon thin film as set forth in claim 6, wherein HMDS gas is employed as the gas containing silicon element which is employed for forming the first thin film, the second thin film and the third thin film.

12. A Silicon thin film formed by the method for forming a Silicon thin film as set forth in claim 6.

13. A Silicon thin film formed by the method for forming a Silicon thin film as set forth in claim 4.

14. A Silicon thin film formed by the method for forming a Silicon thin film as set forth in claim 7.

15. A Silicon thin film formed by the method for forming a Silicon thin film as set forth in claim 9.

16. A Silicon thin film formed by the method for forming a Silicon thin film as set forth in claim 11.

17. A Silicon thin film having isolation function or barrier function, comprising:
a substrate;
a first thin film;
a second thin film; and
a third thin film,
wherein the first thin film, the second thin film, and the third thin film are laminated on the substrate, and
wherein the first thin film contains composition element of H and Si, and the second thin film contains Si, H, C, N, and O by the composition of Si:H:C:N:O=1:3~4:1.5~2.5:0.3~1.5: equal to or less than 0.5, and the third thin film contains Si, and O by the composition of Si:O=1:1.9~2.1.

18. A Silicon thin film as set forth in claim 17, wherein the first thin film is formed as the lowermost layer, and the second thin film and the third thin film are alternately laminated by multiple layers on the first thin film.

* * * * *